United States Patent
Mittra et al.

(10) Patent No.: US 11,855,657 B2
(45) Date of Patent: Dec. 26, 2023

(54) METHOD AND APPARATUS FOR DECODING DATA PACKETS IN COMMUNICATION NETWORK

(71) Applicant: SAMSUNG ELECTRONICS CO., LTD., Suwon-si (KR)

(72) Inventors: Tirthankar Mittra, Karnataka (IN); Seungil Yoon, Suwon-si (KR); Satya Kumar Vankayala, Karnataka (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/856,004

(22) Filed: Jul. 1, 2022

(65) Prior Publication Data
US 2023/0308116 A1    Sep. 28, 2023

Related U.S. Application Data

(63) Continuation of application No. PCT/KR2022/008528, filed on Jun. 16, 2022.

(30) Foreign Application Priority Data

Mar. 25, 2022    (IN) .............................. 202241017089

(51) Int. Cl.
*H03M 13/11*    (2006.01)
*G06F 18/214*   (2023.01)

(52) U.S. Cl.
CPC ......... *H03M 13/114* (2013.01); *G06F 18/214* (2023.01); *H03M 13/1108* (2013.01);
(Continued)

(58) Field of Classification Search
CPC ......... H03M 13/1177; H03M 13/1108; H03M 13/1122; H03M 13/1128; H03M 13/114; G06F 18/214
See application file for complete search history.

(56) References Cited

U.S. PATENT DOCUMENTS 8,291,285 B1 *  10/2012  Varnica .............. H03M 13/1137
                                                          714/752
8,504,887 B1 *  8/2013   Varnica ................ H03M 13/114
                                                          714/790
(Continued)

FOREIGN PATENT DOCUMENTS

CN    113810155      12/2021
KR    10-2012-0091812  8/2012
KR    10-2017-0045728  4/2017

OTHER PUBLICATIONS

N. Shah and Y. Vasavada, "Neural Layered Decoding of 5G LDPC Codes," in IEEE Communications Letters, vol. 25, No. 11, pp. 3590-3593, Nov. 2021.*

(Continued)

*Primary Examiner* — Steve N Nguyen
(74) *Attorney, Agent, or Firm* — Nixon & Vanderhye P.C.

(57) ABSTRACT

The present disclosure relates to a method and an apparatus for decoding data packets in communication network. The method comprises receiving one or more data packets related to each of one or more data types; and decoding the one or more data packets using a parity check matrix associated with the corresponding data type, wherein the parity check matrix comprises a plurality of layers, arranged according to a combination of layers which is determined using a reinforcement model.

17 Claims, 9 Drawing Sheets

(52) U.S. Cl.
CPC .... *H03M 13/1122* (2013.01); *H03M 13/1128* (2013.01); *H03M 13/1177* (2013.01)

(56) References Cited

U.S. PATENT DOCUMENTS

| | | | |
|---|---|---|---|
| 10,797,727 B1* | 10/2020 | Walke | H03M 13/116 |
| 11,275,646 B1* | 3/2022 | Nguyen | G11C 29/50 |
| 11,356,124 B2* | 6/2022 | Kim | H03M 13/458 |
| 2009/0063931 A1 | 3/2009 | Rovini et al. | |
| 2010/0037121 A1 | 2/2010 | Jin et al. | |
| 2018/0241599 A1 | 8/2018 | Park et al. | |
| 2019/0095299 A1* | 3/2019 | Liu | G06N 20/00 |
| 2019/0258936 A1* | 8/2019 | Shamir | G06N 5/01 |
| 2020/0235758 A1* | 7/2020 | Khude | G06N 20/00 |
| 2021/0099251 A1* | 4/2021 | Podlozhnyuk | H03M 13/1137 |
| 2021/0142158 A1* | 5/2021 | Agrawal | G06N 3/044 |
| 2021/0241067 A1* | 8/2021 | Nachmani | H03M 13/152 |
| 2021/0271549 A1* | 9/2021 | Khayat | G11C 29/20 |
| 2021/0383207 A1* | 12/2021 | Beery | G06N 3/047 |
| 2021/0383220 A1* | 12/2021 | Beery | H03M 13/6597 |
| 2022/0078857 A1 | 3/2022 | Kim | |
| 2022/0083860 A1* | 3/2022 | Klein | G06N 20/00 |
| 2022/0095146 A1 | 3/2022 | Elshafie et al. | |
| 2023/0123083 A1 | 4/2023 | Huangfu et al. | |

OTHER PUBLICATIONS

X. Zheng, Q. Hu and J. Feng, "Two Improved Algorithms for Layered QC-LDPC Decoding Algorithm," 2018 IEEE Canadian Conference on Electrical & Computer Engineering (CCECE), Quebec, QC, Canada, 2018, pp. 1-4.*
X. Pang, C. Yang, Z. Zhang, X. You and C. Zhang, "A Channel-Blind Decoding for LDPC Based on Deep Learning and Dictionary Learning," 2019 IEEE International Workshop on Signal Processing Systems (SiPS), Nanjing, China, 2019, pp. 284-289.*
A. Gunturu, A. Agrawal, A. K. R. Chavva and S. Pedamalli, "Machine Learning Based Early Termination for Turbo and LDPC Decoders," 2021 IEEE Wireless Communications and Networking Conference (WCNC), Nanjing, China, 2021, pp. 1-7.*
L. Li, L. Xie, Z. Huang, C. Liu, J. Zhou and Y. Zhang, "A Deep Learning Based Method for Blind Recognition of LDPC Codes," 2021 2nd Information Communication Technologies Conference (ICTC), Nanjing, China, 2021, pp. 112-116.*
X. Wu, M. Jiang and C. Zhao, "Decoding Optimization for 5G LDPC Codes by Machine Learning," in IEEE Access, vol. 6, pp. 50179-50186, 2018.*
Q. Wang, S. Wang, H. Fang, L. Chen, L. Chen and Y. Guo, "A Model-Driven Deep Learning Method for Normalized Min-Sum LDPC Decoding," 2020 IEEE International Conference on Communications Workshops (ICC Workshops), Dublin, Ireland, 2020, pp. 1-6.*
Search Report and Written Opinion dated Dec. 9, 2022 issued in International Patent Application No. PCT/KR2022/008528.
Habib et al., "Learning to Decode: Reinforcement Learning for Decoding of Sparse Graph-Based Channel Codes", 2020, 11 pages.
Zhang et al., "Construction of LDPC Codes Based on Deep Reinforcement Learning", Oct. 18, 2018, 6 pages.

* cited by examiner $$H = \begin{bmatrix} H_1 \\ H_2 \end{bmatrix} = \begin{bmatrix} 1110100 \\ 0001011 \\ \hline 1101001 \\ 0010110 \end{bmatrix} \begin{matrix} \text{LAYER 1} \\ \\ \text{LAYER 2} \end{matrix}$$

600

|  | c0 | c1 | c2 | c3 | c4 | c5 | c6 | c7 | | |
|---|---|---|---|---|---|---|---|---|---|---|
| r0 | 1 | 0 | 1 | 0 | 1 | 0 | 0 | 0 | | LAYER 1. (size=3) |
| r1 | 0 | 1 | 0 | 1 | 0 | 0 | 1 | 0 | | |
| r2 | 0 | 0 | 0 | 0 | 0 | 1 | 0 | 1 | | |
| r3 | 1 | 1 | 0 | 1 | 0 | 0 | 1 | 0 | | |
| Sum of 1s in each column | 2 | 2 | 1 | 2 | 1 | 1 | 2 | 1 | | |

601

|  | c0 | c1 | c2 | c3 | c4 | c5 | c6 | c7 | | |
|---|---|---|---|---|---|---|---|---|---|---|
| r0 | 1 | 0 | 1 | 0 | 1 | 0 | 0 | 0 | | LAYER 1. (size=3) |
| r1 | 0 | 1 | 0 | 1 | 0 | 0 | 1 | 0 | | |
| r2 | 0 | 0 | 0 | 0 | 0 | 1 | 0 | 1 | | |
| r3 | 1 | 1 | 0 | 1 | 0 | 0 | 1 | 0 | | |
| Sum of 1s in each column | 2 | 2 | 1 | 2 | 1 | 1 | 2 | 1 | | |

| | c0 | c1 | c2 | c3 | c4 | c5 | c6 | c7 | | | |
|---|---|---|---|---|---|---|---|---|---|---|---|
| r0 | 1 | 0 | 0 | 0 | 1 | 0 | 0 | 0 | | LAYER 1. (size=4) | |
| r1 | 0 | 1 | 0 | 1 | 0 | 1 | 0 | 0 | | | |
| r2 | 0 | 0 | 1 | 0 | 0 | 0 | 1 | 0 | | | |
| r4 | 0 | 1 | 0 | 1 | 0 | 1 | 0 | 0 | | | |
| Sum of 1s in each column | 1 | 2 | 1 | 1 | 1 | 2 | 1 | 0 | | | |

603

| | c0 | c1 | c2 | c3 | c4 | c5 | c6 | c7 | | | |
|---|---|---|---|---|---|---|---|---|---|---|---|
| r0 | 1 | 0 | 0 | 0 | 1 | 0 | 0 | 0 | | LAYER 1. (size=4) | |
| r1 | 0 | 1 | 0 | 0 | 0 | 1 | 0 | 0 | | | |
| r2 | 0 | 0 | 1 | 0 | 0 | 0 | 1 | 0 | | | |
| r4 | 0 | 0 | 0 | 1 | 0 | 0 | 0 | 1 | | | |
| Sum of 1s in each column | 1 | 1 | 1 | 1 | 1 | 1 | 1 | 1 | | | |

$$H = \begin{array}{|c|c|} \hline [10101010] & \text{Layer1} \\ \hline [01001001] & \text{Layer2} \\ \hline [10010010] & \text{Layer3} \\ \hline [01010101] & \text{Layer4} \\ \hline \end{array}$$

605

| H = | [10010010] | Layer3 | swapped |
|---|---|---|---|
| | [01001001] | Layer2 | |
| | [10101010] | Layer1 | swapped |
| | [01010101] | Layer4 | |

FIG. 6C

METHOD AND APPARATUS FOR DECODING DATA PACKETS IN COMMUNICATION NETWORK

CROSS-REFERENCE TO RELATED APPLICATIONS

This application is a continuation of International Application No. PCT/KR2022/008528 designating the United States, filed on Jun. 16, 2022, in the Korean Intellectual Property Receiving Office and claiming priority to Indian Complete Patent Application No. 202241017089, filed on Mar. 25, 2022, in the Indian Patent Office, the disclosures of which are incorporated by reference herein in their entireties.

BACKGROUND

Field

The disclosure relates to the field of communication networks. For example, the present disclosure relates to a method and an apparatus for decoding data packets in a communication network.

Description of Related Art

With continuous growth of wireless communication systems, network requirements are expanding. Particularly, the network requirements of Fifth Generation (5G) networks include high data rate, low latency, high reliability, energy saving, cost reduction, higher system capacity, high user experience, and the like. Error control codes play a significant role in overall system performance, especially in latency and user experience. The error control codes are used for controlling errors in data over unreliable or noisy communication channels. The error control codes include block codes and convolution codes. Low-Density Parity Check (LDPC) code is a linear error correcting block code. The LDPC codes are used in the 5G networks as it has better performance than other error control codes. The LDPC codes are finding increasing use in applications requiring reliable and highly efficient information transfer in presence of corrupting noise. A message is transmitted over a communication network by performing LDPC encoding at transmitter. Further, the message is decoded by performing LDPC decoding at receiver. The LDPC encoding and the LDPC decoding is used in downlink and uplink shared data channel in the communication network.

In conventional systems, layered LDPC decoding is used to increase speed of the LDPC decoding. The layered LDPC decoding is performed layer by layer sequentially. Decoded result of one layer of a parity check matrix associated with LDPC code is used as input to another layer. This method increases speed of Layered LDPC decoder in decoding the message. There is a requirement to further improve performance of the layered LDPC decoding to meet the network requirements of the communication networks.

The information disclosed in this background of the disclosure section is only for enhancement of understanding of the general background of the disclosure and should not be taken as an acknowledgement or any form of suggestion that this information forms the prior art already known to a person skilled in the art.

SUMMARY

In an example embodiment, the present disclosure discloses a method for decoding data packets in a communication network. The method comprising: receiving one or more data packets related to each of one or more data types; decoding the one or more data packets using a parity check matrix associated with the corresponding data type, wherein the parity check matrix comprises a plurality of layers arranged according to a combination of layers which is determined using a reinforcement model.

In an example embodiment, the present disclosure discloses an apparatus for decoding data packets in a communication network. The apparatus comprises: a processor and a memory. The processor is configured to: receive one or more data packets related to each of one or more data types from a transmitter; decode the one or more data packets using a parity check matrix associated with the corresponding data type, wherein the parity check matrix comprises a plurality of layers arranged according to a combination of layers which is determined using a reinforcement model.

In an example embodiment, the present disclosure discloses a non-transitory computer-readable medium storing instructions which when executed by a processor of an apparatus for decoding data packets in a communication network, cause the apparatus to execute operations. The operations comprises receiving one or more data packets related to each of one or more data types; and decoding the one or more data packets using a parity check matrix associated with the corresponding data type, wherein the parity check matrix comprises a plurality of layers, arranged according to a combination of layers which is determined using a reinforcement model.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other aspects, features and advantages of certain embodiments of the present disclosure will be more apparent from the following detailed description, taken in conjunction with the accompanying drawings, in which:

FIGS. 6A, 6B and 6C are diagrams illustrating examples of decoding data packets in a communication network, according to various embodiments.

Figures 1A, 1B:
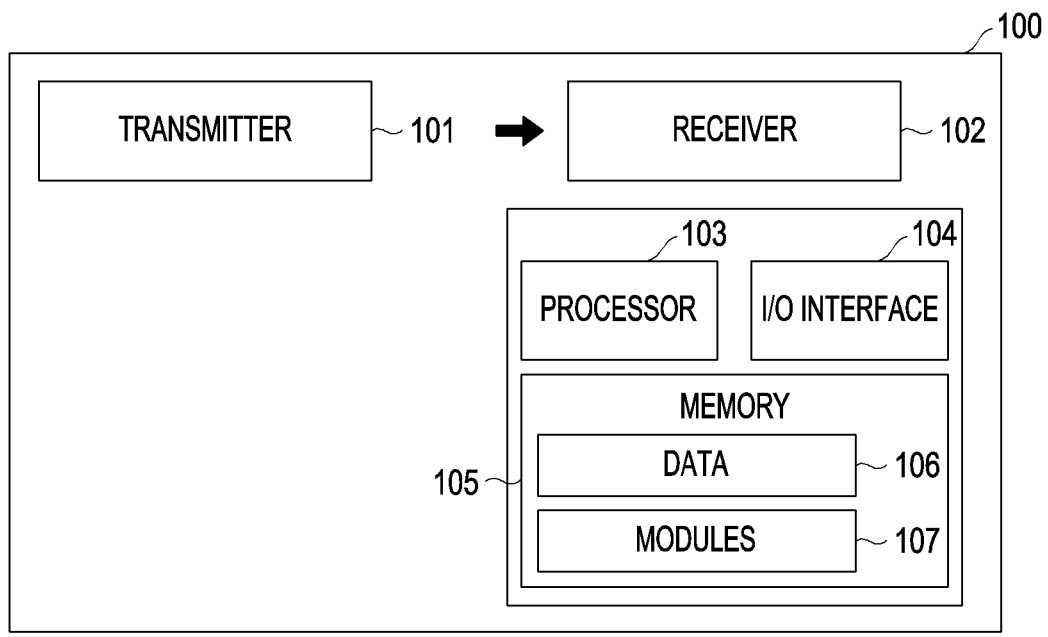
FIG. 1A is a diagram illustrating illustrates an example system for decoding data packets in a communication network, according to various embodiments.
FIG. 1B is a diagram illustrating an example parity check matrix according to various embodiments.

It should be appreciated by those skilled in the art that any block diagram herein represents conceptual views of illustrative systems embodying the principles of the present subject matter. Similarly, it will be appreciated that any flowcharts, flow diagrams, state transition diagrams, pseudo code, and the like represent various processes which may be substantially represented in computer readable medium and executed by a computer or processor, whether or not such computer or processor is explicitly shown.

DETAILED DESCRIPTION

In the present disclosure, the word "exemplary" is used herein to refer to "serving as an example, instance, or illustration." Any embodiment or implementation of the present subject matter described herein as "exemplary" is not necessarily to be construed as preferred or advantageous over other embodiments or examples.

While the disclosure is susceptible to various modifications and alternative forms, specific embodiments thereof are been shown by way of example in the drawings and will be described in greater detail below. It should be understood, however that it is not intended to limit the disclosure to the particular forms disclosed, but on the contrary, the disclosure is intended to cover all modifications, equivalents, and alternatives falling within the scope of the disclosure.

The terms "comprises", "comprising", or any other variations thereof, are intended to cover a non-exclusive inclusion, such that a setup, device or method that comprises a list of components or steps does not include only those components or steps but may include other components or steps not expressly listed or inherent to such setup or device or method. In other words, one or more elements in a system or apparatus proceeded by "comprises . . . a" does not, without more constraints, preclude the existence of other elements or additional elements in the system or apparatus.

In communication networks, data transmitted from transmitter to receiver over a channel is vulnerable to corruption by errors induced by noisy channels and other factors. Error control codes are used for controlling errors in the data over the noisy channels. Examples of the error control codes include Turbo codes, polar codes, LDPC codes, and the like.

The data is encoded with the error control code at transmitter of the communication network. Further, decoding is performed at receiver of the communication network using the error control code. Decoding process needs to be fast and efficient to meet network requirements of the communication network. The present disclosure provides a method and system for decoding data packets in the communication networks. The present disclosure uses reinforcement model to determine pre-determined (e.g., specified) combination of layers of a parity check matrix used for decoding the data packets. The pre-determined combination of layers is identified such that decoder converges faster to solution e.g., faster decoding of the data packets. This results in faster decoding without loss of accuracy and reduces latency. Also, this provides high system throughput and increases user experience.

FIG. 1A is a diagram illustrating an example system 100 for decoding data packets in a communication network, according to various embodiments. The example system 100 comprises a transmitter 101 and a receiver 102. The transmitter 101 and the receiver 102 may communicate over the communication network. The transmitter 101 is a device that transmits the data packets over the communication network to the receiver 102. In an embodiment, the transmitter 101 may be a User Equipment (UE) associated with a user. The UE may be any computing device such as, a laptop computer, a desktop computer, a Personal Computer (PC), a notebook, a smartphone, a tablet, e-book readers, a server, a network server, a cloud-based server, and the like. In another embodiment, the transmitter 101 may be a network component. For example, the transmitter 101 may be a base station. Other examples of the transmitter 101 may include, but not limited to, Radio Access Network (RAN), Evolved Node B (eNodeB or eNB), Next Generation NodeB (gNB), cloud RAN, virtual RAN, and the like. The receiver 102 is a device that receives the data packers from the transmitter 101 over the communication network. In an example, the transmitter 101 may be a UE and the receiver 102 may be a network component, such as, a base station, a Radio Access Network (RAN), Evolved Node B (eNodeB or eNB), Next Generation NodeB (gNB), cloud RAN, virtual RAN, and the like. In another example, the transmitter 101 may be a network component and the receiver 102 may be a UE. In another example, the transmitter 101 and the receiver 102 may be UEs, for example, in a Device-to-Device (D2D) communication. A person skilled in the art will appreciate that the transmitter 101 and the receiver 102 can be any component/ device in the communication network other than abovementioned components/devices. The communication network may be Fifth Generation (5G) network, a Fourth Generation (4G) network, and the like. The communication network may be Wireless-Fidelity (Wi-Fi) network, enhanced Machine-Type Communication (eMTC) and NB-IoT (Narrowband Internet of Things), mm-wave system, and the like.

The data packets may be transmitted from the transmitter 101 over a communication channel to the receiver 102. The communication channel are subject to channel noise, and thus errors may be introduced during transmission from the transmitter 101 to the receiver 102. Error correction codes enable reliable delivery of the data packets over unreliable communication channels. The error correction codes detects the errors and reconstructs original data packets. Examples of error correction codes may include, but not limited to, turbo code, polar code, Low-Density Parity Check (LDPC) code, and the like. The error correction codes are used to detect and correct errors in the data transmitted over the communication network. Particularly, the LPDC code is used in the 5G networks as it has better performance than other error control codes. The LDPC codes are finding increasing use in applications requiring reliable and highly efficient information transfer in presence of corrupting noise. The LPDC code is a linear error correcting code. The LDPC codes functionally are defined by a parity-check matrix. The LDPC code is a linear block code associated with the parity check matrix having a small number of one's. The parity check matrix describes linear relations that components of a codeword must satisfy. For instance, an (n,j,k) LDPC code is specified by the parity check matrix (H matrix) having n-k rows, n columns and j 1's per column. 'N' is code length and 'k' is number of message bits. An example H matrix 108 of a (7, 2, 4) LDPC code is shown in FIG. 1B. The parity check matrix is used at the transmitter 101 and the receiver 102 to perform encoding and decoding of the data packets. These processes are known as LDPC encoding and LDPC decoding. Layered LDPC decoding is used to increase speed of the LDPC decoding. In the layered LDPC decoding, the parity check matrix is divided into multiple layers. The layered LDPC decoding is performed layer by layer sequentially. Decoded result of one layer of the parity check matrix associated with the LDPC code is used as input to another layer. This method increases speed of Layered LDPC decoder in decoding the message. FIG. 1B illustrates the parity check matrix 108 divided into 2 layers.

In an embodiment of the present disclosure, the receiver 102 may be configured to decode the data packets in the communication network. The receiver 102 include Input/Output (I/O) interface (e.g., including input/output circuitry) 104, a memory 105, and Central Processing Units (e.g., including processing circuitry) 103 (also referred as "CPUs" or "a processor 103"). In various embodiments, the memory 105 may be communicatively coupled to the processor 103. The memory 105 stores instructions executable by the processor 103. The processor 103 may comprise at least one data processor for executing program components for executing user or system-generated requests. The memory 105 may be communicatively coupled to the processor 103. The memory 105 stores instructions, executable by the processor 103, which, on execution, may cause the processor 103 to decode the data packets in the communication network. In an embodiment, the memory 105 may include one or more modules (e.g., including various circuitry and/or executable program instructions) 107 and data 106. The one or more modules 107 may be configured to perform the steps of the present disclosure using the data 106, to perform the decoding of the data packets in the communication network. In an embodiment, each of the one or more modules 107 may be a hardware unit which may be outside the memory 105 and coupled with the receiver 102. As used herein, the term modules 107 may refer, for example, to an Application Specific Integrated Circuit (ASIC), an electronic circuit, a Field-Programmable Gate Arrays (FPGA), Programmable System-on-Chip (PSoC), a combinational logic circuit, and/or other suitable components that provide described functionality. The one or more modules 107 when configured with the described functionality defined in the present disclosure will result in a novel hardware. Further, the I/O interface 104 is coupled with the processor 103 through which an input signal or/and an output signal is communicated. For example, the receiver 102 may receive the data packets from the transmitter 101 using the I/O interface 104. The receiver 102 may be configured to receive one or more data packets related to each of one or more data types from the transmitter 101. The one or more data types may refer to different types of data based on type of application, implementation, and the like. Further, the receiver 102 may be configured to decode the one or more data packets related to each data type using a parity check matrix associated with the corresponding data type. The parity check matrix comprises a plurality of layers, each layer comprising a plurality of rows. In the present disclosure, a pre-determined combination of layers of the parity check matrix for decoding is determined using a reinforcement model.

Figure 1C:
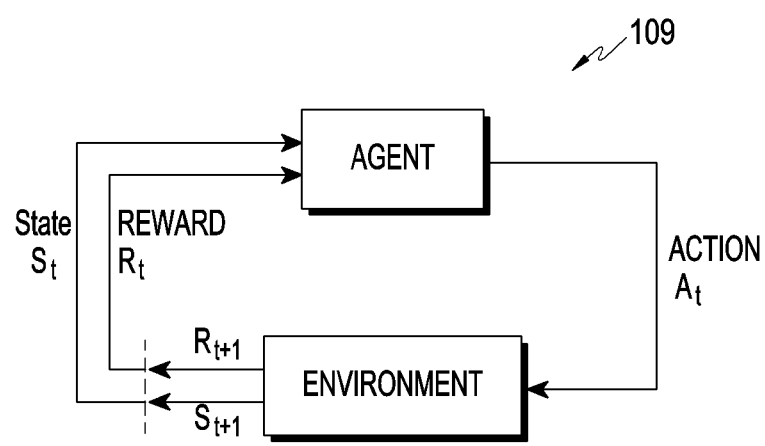
FIG. 1C is a diagram illustrating an example reinforcement model according to various embodiments.

An example reinforcement model 109 is illustrated in FIG. 1C. Reinforcement model 109 is concerned with how intelligent agents ought to take actions in an environment in order to maximize and/or improve the notion of cumulative reward. Agent chooses an action ($A_t$) for a given state $S_t$. The environment transitions from current state $S_t$ to next state $S_{t+1}$, Based on the action ($A_t$). The environment decides reward $R_{t+1}$ for the next state $S_{t+1}$. Based on the next state $S_{t+1}$, the agent again chooses valid action $A_{t+1}$. In an embodiment, job of the agent is to choose actions which leads to states providing highest cumulative rewards in the future, the idea of future rewards is captured by value function. Elements of the reinforcement model 109 that needs to be determined for successful implementation are policy, reward signal, value function, and model of environment. The policy defines the agent's way of behaving at a given time. The policy is a mapping from perceived states of the environment to the actions to be taken when in those states. The reward signal defines the goal in a reinforcement learning problem. On each time step, the environment sends a reward to the agent. The value function defines the total amount of reward an agent can expect to accumulate over the future. The model of the environment allows inferences to be made about how the environment will behave on taking actions. The reinforcement model 109 is pre-trained to determine a pre-determined combination of layers of the parity check matrix. The training of the reinforcement model 109 comprises the following steps. Firstly, training data packets related to each of a plurality of training data types are received. A pre-set parity check matrix is identified for the training data packets related to each training data type. The plurality of layers of the pre-set parity check matrix can be arranged according to a plurality of combinations of layers. The training data packets related to each training data type are decoded using each combination of layers of the plurality of combinations of layers of the pre-set parity check matrix. A decoding time for decoding the training data packets corresponding to each training data type for each combination of layers is measured. One or more combination of layers having a minimum decoding time are identified as the one or more pre-determined combination of layers, for each training data type. The reinforcement model 109 follows an iterative process where pre-determined combination of layers from previous iteration may be used to obtain an improved combination of layers in next iteration. The process is carried on until there is no further improvement in the decoding time.

Figure 2:
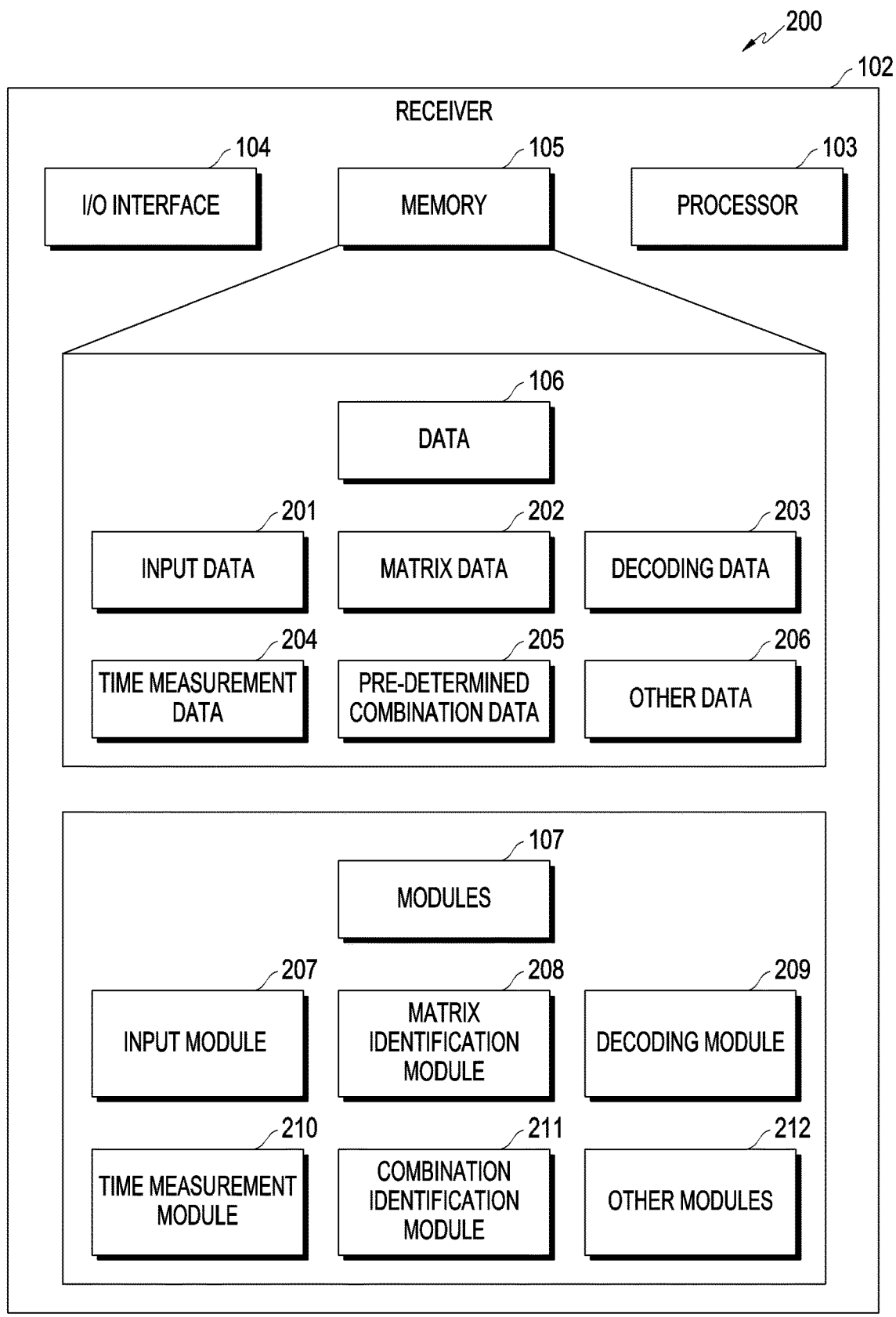
FIG. 2 is a block diagram illustrating an example configuration of a receiver for decoding data packets in a communication network, according to various embodiments.

FIG. 2 is a block diagram 200 illustrating an example configuration of the receiver 102 for decoding the data packets in the communication network, according to various embodiments. The receiver 102 may comprise the processor (e.g., including processing circuitry) 103, the I/O interface (e.g., including I/O circuitry) 104, and the memory 105. In an embodiment, the memory 105 may include the one or more modules 107 and data 106.

In an implementation, the modules 107 may include, for example, an input module 207, a matrix identification module 208, a decoding module 209, a time measurement module 210, a combination identification module 211, and other modules 212. It will be appreciated that such aforementioned modules 107 may be represented as a single module or a combination of different modules. In one implementation, the data 106 may include, for example, input data 201, matrix data 202, decoding data 203, time measurement data 204, pre-determined combination data 205, and other data 206.

In an embodiment, the input module 207 may be configured to receive the training data packets related to each of the plurality of training data types. The training data packets may be provided by a user for training the reinforcement model 109. The training data packets may be related to the plurality of training data types. The plurality of training data types may comprise different types of data based on implementation, application, and the like. For example, the plurality of training data types may comprise data with different number of data bits. In an example, the training data packets may comprise 40 data packets. There may be 10 data packets, each having 3 bits. There may be 20 data packets, each having 4 bits. There may be 10 data packets, each having 5 bits. In another example, noise in communication channel may be modified to obtain the plurality of training data types. A person skilled in the art will appreciate that the plurality of training data types is not limited to above-mentioned training data types and can include other training data types. The training data packets may be stored as the input data 201 in the memory 105. The input module 207 may be further configured to receive the one or more data packets related to each of one or more data types from the transmitter 101. The input module 207 may receive the one or more data packets in real-time. The one or more data packets may be stored as the input data 201 in the memory 105.

In an embodiment, the matrix identification module 208 may be configured to receive the one or more training data packets. Further, the matrix identification module 208 may be configured to identify the pre-set parity check matrix for the training data packets related to each training data type. There may be pre-set parity check matrices for each training data type. The pre-set parity check matrices may be associated with the training data type based on application, implementation, and the like. For example, the pre-set parity check matrix may be defined for 5G applications. In another example, there may be multiple pre-set parity check matrices defined for data packets with different lengths. The pre-set parity check matrix and the corresponding training data type may be stored as the matrix data 202 in the memory 105.

In an embodiment, the decoding module 209 may be configured to decode the training data packets related to each training data type using each combination of layers of the plurality of combinations of layers of the pre-set parity check matrix. The pre-set parity check matrix comprises a plurality of layers. The plurality of combinations of layers can be formed from the plurality of layers. The plurality of combinations of layers may be L factorial (represented as L!) when the plurality of layers is L. For example, the pre-set parity check matrix may comprise 7 layers. The plurality of combinations of layers may be 5040. The decoding module 209 may decode the training data packets using combination of layers identified using upper bound action selection method. A value of L! may be very large even for small values of L. This is computationally infeasible to check all combination of layers. Hence, the present disclosure uses upper confidence bound action selection method to select only certain set of combination of layers out of L! based on priority. The priority is based on a reward provided to the reinforcement model 109 and frequency of using the combination of layers. Higher priority may be provided to the combination of layers with higher reward and least frequently used combination of layers.

Figure 3:
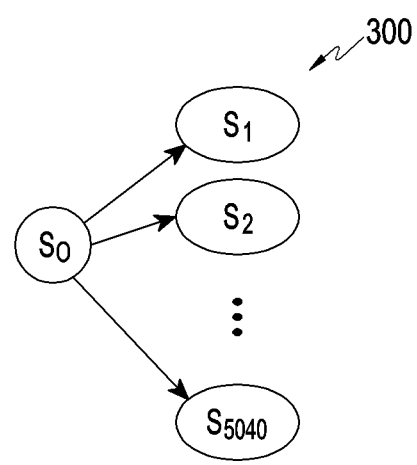
FIG. 3 is a diagram illustrating an example of decoding data packets in a communication network, according to various embodiments.

FIG. 3 is a diagram illustrating an example of decoding data packets in a communication network, according to various embodiments. Referring to example 300 of FIG. 3, there may be an initial state $S_0$. The reinforcement model 109 may have a set of actions from state $S_0$. The set of actions may be {"0, 1, 2, . . . , L", "1, 4, 3 . . . , L"—"2, 0, 1, . . . , L"}. The action "0, 1, 2, . . . , L" may refer to layer 0 being used first, result of layer 0 is used in Layer 1, result of Layer 1 is used in Layer 2 so on and so forth. There are L! total actions. Since one action leads to one state, there are L! next states. As a policy, layers are not repeated in next selection, because repeating same layers may not produce faster convergence. The reinforcement model 109 may select the action "0, 1, 2, . . . , L". The action causes the environment to transition from the initial state $S_0$ to next state $S_1$. The decoding is performed using the combination of layers "0, 1, 2, . . . , L". Similarly, the reinforcement model 109 may select the action "1, 4, 3 . . . , L", causing the environment to transition from the state $S_1$ to next state $S_2$. Similarly, the reinforcement model 109 may select other actions from the L! actions until the transition of environment from state $S_{5039}$ to $S_{5040}$. In an embodiment, the decoding module 209 may communicate with a conventional hardware decoder. The decoding module 209 may decode the training data packets using each of the combination of layers by communicating with the decoder. Data related to decoding the training data packets may be stored as the decoding data 203 in the memory 105. The decoding module 209 may be further configured to decode the one or more data packets related to each data type using the parity check matrix associated with the corresponding data type, arranged according to the pre-determined combination of layers. The decoding module 209 may decode the one or more data packets using the parity check matrix arranged according to the pre-determined combination of layers in real-time. Data related to the decoding of the one or more data packets may be stored as the decoding data 203 in the memory 105.

In an embodiment, the time measurement module 210 may be configured to receive the data related to decoding the training data packets from the decoding module 209. Further, the time measurement module 210 may measure a decoding time associated with decoding of the training data packets corresponding to each training data type for each combination of layers. The decoding of the training data packets related to each training data type may require multiple iterations to complete successful decoding. The decoding time is directly proportional to the number of iterations required to complete the successful decoding. In an embodiment, the completion of the successful decoding is determined when a product of a result of an iteration from one or more iterations associated with each combination of layers and the pre-set parity check matrix is a zero matrix. Each iteration results in a codeword. A transpose of the codeword is termed as the result of the iteration. The product or the matrix multiplication of the result of the iteration and the pre-set parity check matrix leading to the zero matrix indicates successful decoding. The successful decoding is represented by equation (1) below:

$$[H \text{ matrix}]*[\text{codeword's transpose}]=[\text{Zero Matrix}] \quad (1)$$

As the number of iterations increases, the decoding time increases. The agent in the reinforcement model 109 is provided with a reward for the action. For example, when the result of an iteration does not converge to the solution, −1 may be provided as the reward. When the result converges to the solution, +5 may be provided as the reward. A value represents the total reward provided to the agent for each of the plurality of combinations. The value is assigned to each of the plurality of combinations of layers based on tentative number of iterations required by each combination of layers to complete successful decoding of the training data packets. The decoding time decreases as the value increases. The time measurement module 210 measures the decoding time for each combination of layers based on the value. The decoding time for each combination of layers may be stored as the time measurement data 204 in the memory 105.

In an embodiment, the combination identification module 211 may be configured to receive the time measurement data 204 from the time measurement module 210. Further, the combination identification module 211 may be configured to identify one or more combination of layers having a minimum decoding time as the one or more pre-determined combination of layers, for each training data type. The combination identification module 211 identifies the combination of layers having the minimum decoding time based on the value assigned to each of the plurality of combinations of layers. The combination identification module 211 may decode a training data packet from the training data packets using each combination of the plurality of combinations of the plurality of layers. The combination identification module 211 may identify the one or more combination of layers having the minimum decoding time as the one or more pre-determined combination of layers. Further, the combination identification module 211 may decode other training data packets using the one or more pre-determined combination of layers. The combination identification module 211 may identify the pre-determined combination of layers with the minimum decoding time, from the one or more pre-determined combination of layers. For example, there may be five training data packets. The combination identification module 211 may decode a first training data packet using each combination of the plurality of combinations of the plurality of layers. The combination identification module 211 may identify three pre-determined combinations of layers. Further, the combination identification module 211 may decode remaining four training data packets using the three pre-determined combinations of layers to identify the pre-determined combination of layers. The pre-determined combination of layers for each training data type may be stored as the pre-determined combination data 205 in the memory 105. The process of identifying the pre-determined combination of layers is carried out until there is no further improvement in the decoding time. In an embodiment, instead of always greedily exploiting the pre-determined combination of layers, the present disclosure explores other actions using upper confidence bound action selection method. The upper confidence bound action selection method selects only certain combination of layers. An upper confidence bound action value is selected based on the priority. The priority is based on the reward and the least frequently used combination of layers. Hence, the reinforcement model 109 exploits the combination of layers based on the upper confidence bound action value. The reinforcement model 109 discovers policies or rules. Some of these policies or rules are generic and can be applied to all data types and some are data type specific policies. The method of the present disclosure comprises updating the parity check matrix based on one or more policies obtained from the reinforcement model 109. The reinforcement model 109 may learn or discover the one or more polices during training. The one or more policies may comprise general polices such as presence of a single '1' bit in each column from one or more columns in each layer from the plurality of layers in the parity check matrix, presence of at least one '1' bit in each column of each layer from the plurality of layers and the like, and may comprise specific policies, but not limited to, prioritizing each row from one or more rows in each layer from the plurality of layers satisfying a pre-defined parity equation, and the like. The one or more policies are explained in detail in later part of the description.

The other data 206 may store data, including temporary data and temporary files, generated by the one or more modules 107 for performing the various functions of the receiver 102. The one or more modules 107 may also include the other modules 212 to perform various miscellaneous functionalities of the receiver 102. The other data 206 may be stored in the memory 105. It will be appreciated that the one or more modules 107 may be represented as a single module or a combination of different modules.

Figure 4:
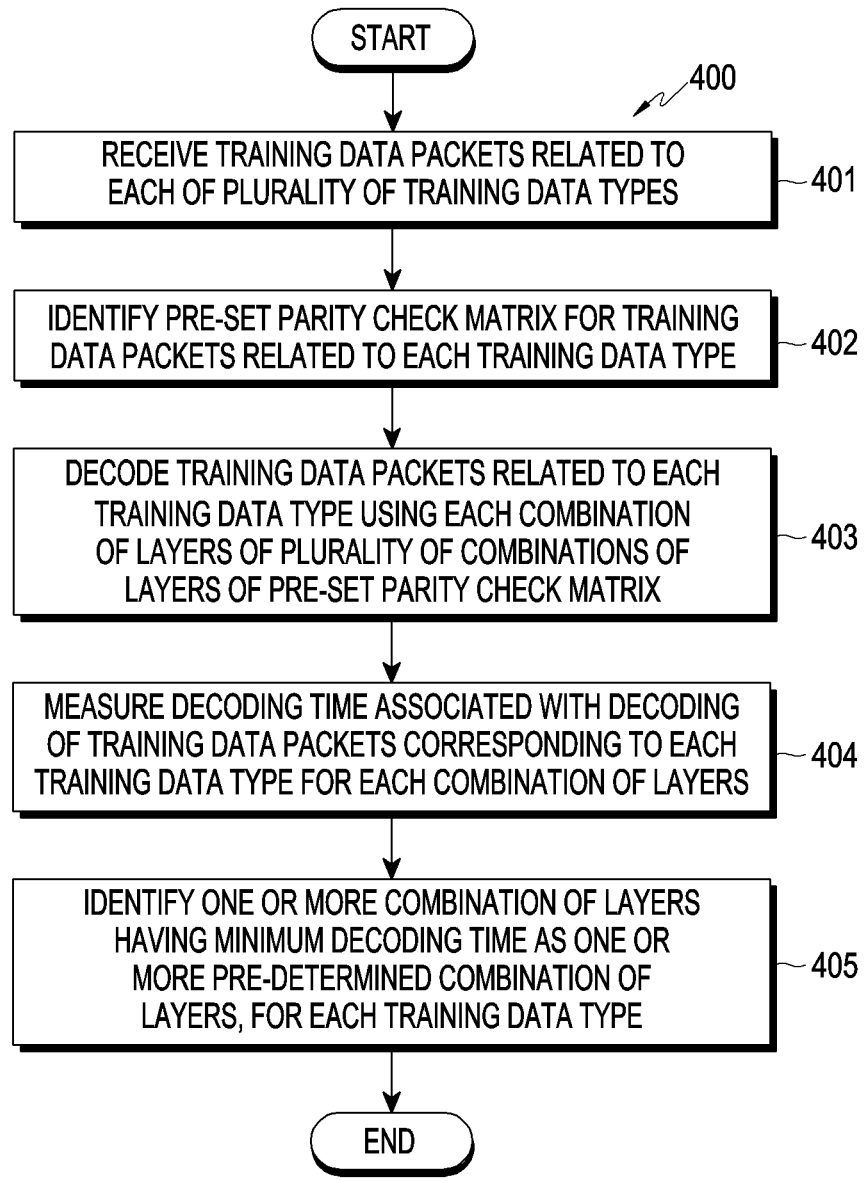
FIG. 4 is a flowchart illustrating an example method for training a reinforcement model, according to various embodiments.

FIG. 4 is a flowchart illustrating an example method for training the reinforcement model, according to various embodiments. As illustrated in FIG. 4, the method 400 may comprise one or more operations. The method 400 may be described in the general context of computer executable instructions. Generally, computer executable instructions can include routines, programs, objects, components, data structures, procedures, modules, and functions, which perform particular functions or implement particular abstract data types.

The order in which the method 400 is described is not intended to be construed as a limitation, and any number of the described method blocks can be combined in any order to implement the method. Additionally, individual blocks may be deleted from the methods without departing from the scope of the subject matter described herein. Furthermore, the method can be implemented in any suitable hardware, software, firmware, or combination thereof.

At operation 401, the training data packets related to each of the plurality of training data types are received. The training data packets of different data types may be provided by the user for training the reinforcement model 109. The plurality of training data types may comprise different types of data based on implementation, application, and the like.

At operation 402, the pre-set parity check matrix is identified for the training data packets related to each training data type. The pre-set parity check matrices may be associated with the training data type based on application, implementation, and the like. For example, the pre-set parity check matrix may be defined for 5G applications.

At operation 403, the training data packets related to each training data type are decoded using each combination of layers of the plurality of combinations of layers of the pre-set parity check matrix. The pre-set parity check matrix comprises a plurality of layers. The plurality of combinations of layers can be formed from the plurality of layers. The plurality of combinations of layers may be L! when the plurality of layers is L. The system 100 may decode the training data packets using combination of layers determined using upper confidence bound action selection method.

At operation 404, the decoding time associated with decoding of the training data packets corresponding to each training data type is measured for each combination of layers. The decoding time is directly proportional to the number of iterations required to complete the successful decoding. The completion of the successful decoding is determined when the product of a result of an iteration from one or more iterations associated with each combination of layers and the pre-set parity check matrix is a zero matrix. The agent in the reinforcement model 109 is provided with a reward for the action. The value is assigned to each of the plurality of combinations of layers based on tentative number of iterations required by each combination of layers to complete successful decoding of the training data packets. The decoding time decreases as the value increases. The system 100 measures the decoding time for each combination of layers based on the value.

At operation 405, the one or more combination of layers having the minimum decoding time are identified as the one or more pre-determined combination of layers, for each training data type. The system 100 identifies the combination of layers having the minimum decoding time based on the value assigned to each of the plurality of combinations of layers. The system 100 may decode a training data packet from the training data packets using each combination of the plurality of combinations of the plurality of layers. The system 100 may identify the one or more combination of layers having the minimum decoding time as the one or more pre-determined combination of layers. Further, the system 100 may decode other training data packets using the one or more pre-determined combination of layers. The system 100 may identify the pre-determined combination of layers with the minimum decoding time, from the one or more pre-determined combination of layers.

Figure 5:
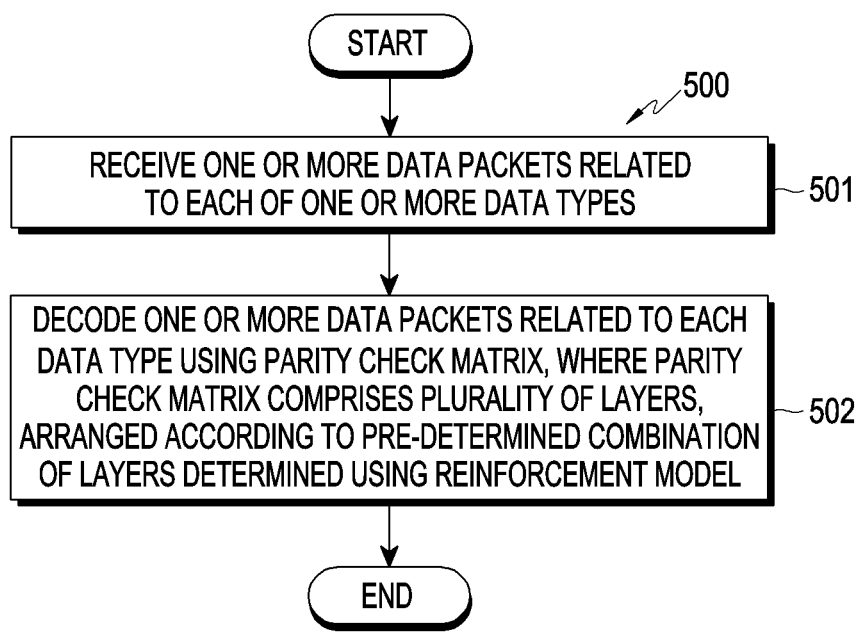
FIG. 5 is a flowchart illustrating an example method for decoding data packets in a communication network, according to various embodiments.

FIG. 5 is a flowchart illustrating an example method for decoding the data packets in the communication network, according to various embodiments. As illustrated in FIG. 5, the method 500 may comprise one or more operations. The method 500 may be described in the general context of computer executable instructions. Generally, computer executable instructions can include routines, programs, objects, components, data structures, procedures, modules, and functions, which perform particular functions or implement particular abstract data types.

The order in which the method 500 is described is not intended to be construed as a limitation, and any number of the described method blocks can be combined in any order to implement the method. Additionally, individual blocks may be deleted from the methods without departing from the scope of the subject matter described herein. Furthermore, the method can be implemented in any suitable hardware, software, firmware, or combination thereof.

At operation 501, the one or more data packets related to each of the one or more data types are received. The one or more data packets may be received from the transmitter 101. For example, the UE may transmit uplink information to the base station. The base station may receive the one or more data packets.

At operation 502, the one or more data packets related to each data type are decoded using the parity check matrix associated with the corresponding data type. The parity check matrix is arranged according to the pre-determined combination of layers determined for the corresponding data type using the reinforcement model 109. The decoding is faster as the pre-determined combination of layers that converges faster to the solution is determined.

In an embodiment, the method of the present disclosure further comprises updating the parity check matrix based on one or more policies obtained from the reinforcement model 109. In an embodiment, the reinforcement model 109 may learn or discover the one or more polices during training. The one or more policies may comprise general policies applicable to different types of data and data-specific policies. The general policies may comprise at least one of, presence of a single '1' bit in each column from one or more columns in each layer from the plurality of layers in the parity check matrix, presence of at least one '1' bit in each column of each layer from the plurality of layers and the like.

FIG. 6A is a diagram illustrating an example policy e.g., presence of a single '1' bit in each column from one or more columns in each layer from the plurality of layers in the parity check matrix. The reinforcement model 109 may determine that presence of single '1' bit in each column results in faster decoding. 600 in FIG. 6A illustrates a parity check matrix in which certain columns have more than one '1' bits. 601 in FIG. 6A illustrates the parity check matrix in which row 3 is replaced with another row such that each column has a single '1' bit. FIG. 6B is a diagram illustrating an example policy e.g., presence of at least one '1' bit in each column of each layer from the plurality of layers. 602 in FIG. 6B illustrates a parity check matrix in which certain columns do not comprise '1' bit. 603 in FIG. 6B illustrates the parity check matrix in which row 3 is replaced with another row such that each column has at least one '1' bit. The specific policies may include, but not limited to, prioritizing each row from one or more rows in each layer from the plurality of layers satisfying a pre-defined parity equation. FIG. 6C is a diagram illustrating an example for the above-mentioned policy. 604 in FIG. 6C illustrates a parity check matrix with value of 'n' as 8. If Rx (=1 if Rx [i]<=0 else 0 for all 0<=i<=7) is demodulated, then only third layer of H matrix satisfies the pre-defined parity check equation. 605 in FIG. 6C illustrates the parity check matrix in which third layer is swapped with first layer for faster decoding.

Embodiments of the present disclosure may use a reinforcement model to determine pre-determined combination of layers of a parity check matrix used for decoding the data packets. The pre-determined combination of layers is identified such that decoder converges faster to solution e.g., faster decoding of the data packets. This results in faster decoding without loss of accuracy and reduces latency. Also, this provides high system throughput and increases user experience.

The terms "an embodiment", "embodiment", "embodiments", "the embodiment", "the embodiments", "one or more embodiments", "some embodiments", and "one embodiment" may refer to "one or more (but not all) embodiments of the disclosure(s)" unless expressly specified otherwise.

The terms "including", "comprising", "having" and variations thereof may denote "including but not limited to", unless expressly specified otherwise.

The enumerated listing of items does not imply that any or all of the items are mutually exclusive, unless expressly specified otherwise. The terms "a", "an" and "the" may refer to "one or more", unless expressly specified otherwise.

A description of an embodiment with several components in communication with each other does not imply that all such components are required. A variety of optional components are described to illustrate the wide variety of possible embodiments of the disclosure.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article, or a different number of devices/articles may be used instead of the shown number of devices or programs. The functionality and/or the features of a device may be alternatively embodied by one or more other devices which are not explicitly described as having such functionality/features. Thus, other embodiments of the disclosure need not include the device itself.

The illustrated operations of FIG. 3 show certain events occurring in a certain order. In various embodiments, certain operations may be performed in a different order, modified, or removed. Moreover, steps may be added to the above described logic and still conform to the described embodiments. Further, operations described herein may occur sequentially or certain operations may be processed in parallel. Yet further, operations may be performed by a single processing unit or by distributed processing units.

The language used in the disclosure has been principally selected for readability and instructional purposes, and it may not have been selected to delineate or circumscribe the disclosed subject matter. It is therefore intended that the scope of the disclosure be limited not by this detailed description. Accordingly, the disclosure of the embodiments of the disclosure is intended to be illustrative, but not limiting, of the scope of the disclosure, which is set forth in the following claims.

While the disclosure has been illustrated and described with reference to various example embodiments, it will be understood that the various embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. A method for decoding data packets by an apparatus including a processor, in a communication network, the method comprising:
   pre-training, by the processor, a reinforcement model;
   receiving, by the processor, one or more data packets related to each of one or more data types; and
   decoding, by the processor, the one or more data packets using a parity check matrix associated with a corresponding data type, wherein the parity check matrix comprises a plurality of layers, arranged according to a combination of layers which is determined using the pre-trained reinforcement model,
   wherein pre-training the reinforcement model comprises:
      receiving, by the processor, training data packets related to each of a plurality of training data types;
      identifying, by the processor, a pre-set parity check matrix for the training data packets related to each of the plurality of training data types;
      decoding, by the processor, the training data packets related to each of the plurality of training data types using each combination of layers of a plurality of combinations of layers of the pre-set parity check matrix;
      measuring, by the processor, a decoding time associated with decoding of the training data packets related to each of the plurality of training data types for each combination of layers; and
      identifying, by the processor, one or more combination of layers having a minimum decoding time for each training data type based on the measured decoding time.

2. The method of claim 1, wherein the one or more combination of layers having the minimum decoding time is identified based on a value assigned to each of the plurality of combinations of layers, the value relating to a decoding time required by corresponding combination of layers to complete decoding.

3. The method of claim 2, wherein the value is assigned to each of the plurality of combinations of layers based on a tentative number of iterations required by each combination of layers to complete successful decoding of the training data packets.

4. The method of claim 3, wherein completion of the successful decoding is determined based on a product of a result of an iteration from one or more iterations associated with each combination of layers and the pre-set parity check matrix being a zero matrix.

5. The method of claim 1, wherein the combination of layers are identified from at least one combination of layers, wherein the method comprises:
   decoding a training data packet from training data packets using each combination of a plurality of combinations of the plurality of layers, wherein each layer comprises a plurality of rows;
   identifying the at least one combinations having the minimum decoding time for the training data packet, from the plurality of combinations;
   decoding other training data packets using the at least one combination of layers; and
   identifying the combination of layers with the minimum decoding time, from the at least one combination of layers.

6. The method of claim 1, further comprising: updating the parity check matrix based on one or more policies obtained from the reinforcement model, wherein the one or more policies comprises at least one of, presence of a single '1' bit in each column from one or more columns in each layer from the plurality of layers in the parity check matrix, presence of at least one '1' bit in each column of each layer from the plurality of layers, and prioritizing each row from one or more rows in each layer from the plurality of layers satisfying a specified parity equation.

7. An apparatus for decoding data packets in a communication network, the apparatus comprising:
   a processor; and
   a memory, wherein the memory stores processor-executable instructions, which, on execution, cause the processor to:
      pre-train a reinforcement model;
      receive one or more data packets related to each of one or more data types from a transmitter; and
      decode the one or more data packets using a parity check matrix associated with a corresponding data type, wherein the parity check matrix comprises a plurality of layers, arranged according to a combination of layers which is determined using a pre-trained reinforcement model,
   wherein for pre-training the reinforcement model, the instructions cause the processor further to:
      receive training data packets related to each of a plurality of training data types;
      identify a pre-set parity check matrix for the training data packets related to each of the plurality of training data types;
      decode the training data packets related to each of the plurality of training data types using each combination of layers of a plurality of combinations of layers of the pre-set parity check matrix;
      measure a decoding time associated with decoding of the training data packets related to each of the plurality of training data types for each combination of layers; and
      identify one or more combination of layers having a minimum decoding time for each training data type based on the measured decoding time.

8. The apparatus of claim 7, wherein the one or more combination of layers having the minimum decoding time is identified based on a value assigned to each of the plurality of combinations of layers, the value relating to a decoding time required by corresponding combination of layers to complete decoding.

9. The apparatus of claim 8, wherein the value is assigned to each of the plurality of combinations of layers is based on tentative number of iterations required by each combination of layers to complete successful decoding of the training data packets.

10. The apparatus of claim 9, wherein completion of the successful decoding is determined based on a product of a result of an iteration from one or more iterations associated with each combination of layers and the pre-set parity check matrix being a zero matrix.

11. The apparatus of claim 7, wherein the combination of layers are identified from at least one combination of layers, wherein the processor is configured to:
- decode a training data packet from training data packets using each combination of a plurality of combinations of the plurality of layers, wherein each layer comprises a plurality of rows;
- identify the at least one combinations having the minimum decoding time for the training data packet, from the plurality of combinations;
- decode other training data packets using the at least one combination of layers; and
- identify the combination of layers with the minimum decoding time, from the at least one combination of layers.

12. The apparatus of claim 7, wherein the processor is further configured to update the parity check matrix based on one or more policies obtained from the reinforcement model, wherein the one or more policies comprises at least one of, presence of a single '1' bit in each column from one or more columns in each layer from the plurality of layers in the parity check matrix, presence of at least one '1' bit in each column of each layer from the plurality of layers, and prioritizing each row from one or more rows in each layer from the plurality of layers satisfying a specified parity equation.

13. A non-transitory computer-readable medium storing instructions which when executed by a processor of an apparatus for decoding data packets in a communication network, cause the apparatus to execute operations, the operations comprising:
- pre-training a reinforcement model;
- receiving one or more data packets related to each of one or more data types; and
- decoding the one or more data packets using a parity check matrix associated with a corresponding data type, wherein the parity check matrix comprises a plurality of layers, arranged according to a combination of layers which is determined using a reinforcement model,
- wherein pre-training the reinforcement model comprises:
  - receiving training data packets related to each of a plurality of training data types;
  - identifying a pre-set parity check matrix for the training data packets related to each of the plurality of training data types;
  - decoding the training data packets related to each of the plurality of training data types using each combination of layers of a plurality of combinations of layers of the pre-set parity check matrix;
  - measuring a decoding time associated with decoding of the training data packets related to each of the plurality of training data types for each combination of layers; and
  - identifying one or more combination of layers having a minimum decoding time for each training data type based on the measured decoding time.

14. The non-transitory computer-readable medium of claim 13, wherein the one or more combination of layers having the minimum decoding time is identified based on a value assigned to each of the plurality of combinations of layers, the value relating to a decoding time required by corresponding combination of layers to complete decoding.

15. The non-transitory computer-readable medium of claim 14, wherein the value is assigned to each of the plurality of combinations of layers based on a tentative number of iterations required by each combination of layers to complete successful decoding of the training data packets, and
- wherein completion of the successful decoding is determined based on a product of a result of an iteration from one or more iterations associated with each combination of layers and the pre-set parity check matrix being a zero matrix.

16. The non-transitory computer-readable medium of claim 13, wherein the combination of layers are identified from at least one combination of layers, wherein the operations further comprises:
- decoding a training data packet from training data packets using each combination of a plurality of combinations of the plurality of layers, wherein each layer comprises a plurality of rows;
- identifying the at least one combinations having the minimum decoding time for the training data packet, from the plurality of combinations;
- decoding other training data packets using the at least one combination of layers; and
- identifying the combination of layers with the minimum decoding time, from the at least one combination of layers.

17. The non-transitory computer-readable medium of claim 13, wherein the operations further comprises: updating the parity check matrix based on one or more policies obtained from the reinforcement model, wherein the one or more policies comprises at least one of, presence of a single '1' bit in each column from one or more columns in each layer from the plurality of layers in the parity check matrix, presence of at least one '1' bit in each column of each layer from the plurality of layers, and prioritizing each row from one or more rows in each layer from the plurality of layers satisfying a specified parity equation.

* * * * *